(12) United States Patent
Jo

(10) Patent No.: US 8,253,256 B2
(45) Date of Patent: Aug. 28, 2012

(54) STACKED SEMICONDUCTOR PACKAGE

(75) Inventor: Jae Ho Jo, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 318 days.

(21) Appl. No.: 12/605,444

(22) Filed: Oct. 26, 2009

(65) Prior Publication Data
US 2011/0031599 A1 Feb. 10, 2011

(30) Foreign Application Priority Data
Aug. 10, 2009 (KR) .................. 10-2009-0073507

(51) Int. Cl.
*H01L 23/48* (2006.01)

(52) U.S. Cl. .............. 257/777; 257/686; 257/E23.011

(58) Field of Classification Search .............. 257/686, 257/777, E23.001
See application file for complete search history.

(56) References Cited

U.S. PATENT DOCUMENTS
2009/0278246 A1* 11/2009 Hoshino et al. .............. 257/686

FOREIGN PATENT DOCUMENTS
| JP | 2000-260933 A | 9/2000 |
| JP | 2002-110896 A | 4/2002 |
| KR | 1020080001589 A | 1/2008 |
| KR | 10-0886720 B1 | 2/2009 |
| KR | 1020090084645 A | 8/2009 |
| WO | WO/2007/029384 * | 3/2007 |

* cited by examiner

*Primary Examiner* — Zandra Smith
*Assistant Examiner* — Jamie C Niesz
(74) *Attorney, Agent, or Firm* — Ladas & Parry LLP

(57) ABSTRACT

A stacked semiconductor package includes a first semiconductor package having a first semiconductor chip having a first surface and a second surface facing away from the first surface, first bonding pads disposed on the first surface, and through-electrodes electrically connected with the first bonding pads The through-electrodes pass through the first and second surfaces of the first chip and extend from the second surface. A second semiconductor package has a through-holes defined therein into which the through-electrodes are inserted and second bonding pads electrically connected with the through-electrodes.

13 Claims, 5 Drawing Sheets

STACKED SEMICONDUCTOR PACKAGE

CROSS-REFERENCE TO RELATED APPLICATIONS

The present application claims priority to Korean patent application number 10-2009-0073507 filed on Aug. 10, 2009, which is incorporated herein by reference in its entirety.

BACKGROUND OF THE INVENTION

The present invention relates generally to a stacked semiconductor package, and more particularly to a stacked semiconductor package having reduced volume and reliability.

As a current design trend, semiconductor chips capable of storing and processing huge amounts of data within extremely short time periods and semiconductor packages having the semiconductor chips have and are being developed.

Stacked semiconductor packages having at least two semiconductor chips stacked together have been proposed for use in enhancing data storage capacities and for use in increasing data processing speeds.

A conventional stacked semiconductor package includes at least two semiconductor chips having through-electrodes, and connection members interposed between the through-electrodes to electrically connect the through-electrodes of the respective semiconductor chips.

The conventional stacked semiconductor package requires a process for forming the through-electrodes in respective semiconductor chips, a process for stacking the respective semiconductor chips formed with the through-electrodes, and a process for electrically connecting the respective through-electrodes. Therefore, the number of processes for manufacturing the stacked semiconductor package is high, and the manufacturing cost of the stacked semiconductor package is high as well.

Further, the process for forming the through-electrodes in the respective semiconductor chips requires a high degree of precision, and therefore defects frequently occur during the formation of the through-electrodes.

Further, the thickness and volume of the stacked semiconductor package markedly increase due to the presence of the connection members for electrically connecting the through-electrodes of the respective stacked semiconductor chips.

BRIEF SUMMARY OF THE INVENTION

Embodiments of the present invention include a stacked semiconductor package having a reduced number of manufacturing processes, reduced manufacturing cost, preventing defects from being caused in through-electrodes, and having a reduced thickness.

In one aspect of the present invention, a stacked semiconductor package comprises a first semiconductor package having a first semiconductor chip which has a first surface and a second surface facing away from the first surface, first bonding pads which are disposed on the first surface, and through-electrodes which are electrically connected with the first bonding pads, pass through the first and second surfaces and have a column-like configuration projecting from the second surface; and a second semiconductor package having through-holes into which the through-electrodes are inserted and second bonding pads which are electrically connected with the through-electrodes.

The through-holes may be defined at positions that correspond to the first and second bonding pads.

The stacked semiconductor package may further comprise flowable conductive members interposed between the first and second semiconductor chips and electrically connecting the second bonding pads and the through-electrodes with each other.

The flowable conductive members may contain any one of conductive polymer, conductive particles and solder paste.

The stacked semiconductor package may further comprise gap-fill members interposed between the first and second semiconductor chips and attaching the first and second semiconductor chips to each other.

At least two second semiconductor chips may be stacked.

The through-holes of the second semiconductor chips may have a first sectional area, the through-electrodes may have a second sectional area less than the first sectional area, and flowable conductive members may be interposed between the through-electrodes and inner surfaces of the second semiconductor chips which are formed due to defining of the through-holes.

The stacked semiconductor package may further comprise a substrate having connection pads which are electrically connected with ends of the through-electrodes.

The substrate may have grooves which are defined at positions corresponding to the ends of the through-electrodes, and the connection pads are disposed in the grooves.

The through-electrodes may have a configuration in which a sectional area gradually decreases in a direction facing away from the first surface of the first semiconductor chip.

The through-holes of the second semiconductor chips may have the sectional shape of a circle, a triangle, a quadrangle, an ellipse, or a polygon when viewed from the top.

The through-electrodes may have the sectional shape of a circle, an ellipse, or a polygon.

The stacked semiconductor package may further comprise an insulation layer placed on the inner surfaces of the second semiconductor chips, which are formed due to defining of the through-holes; and a lubrication layer placed on the insulation layer.

At least two second semiconductor chips may be stacked, a sectional area of the through-holes of the second semiconductor chips which are placed at the same position may decrease in a stepwise manner in a direction facing away from the first semiconductor chip, and the through-electrodes may have the sectional area corresponding to the sectional area of the through-holes.

DESCRIPTION OF SPECIFIC EMBODIMENTS

It is understood herein that the drawings are not necessarily to scale and in some instances proportions may have been exaggerated in order to more clearly depict certain features of the invention.

Figure 1:
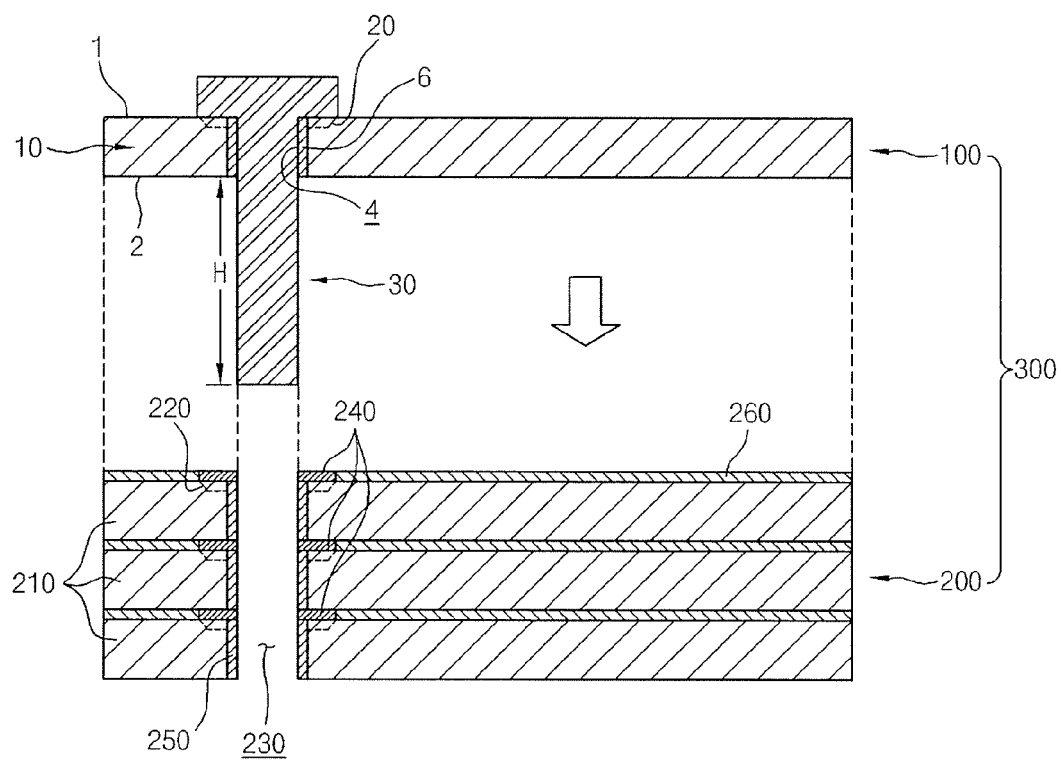
FIG. 1 is a cross-sectional view showing a stacked semiconductor package in accordance with an embodiment of the present invention.

FIG. 1 is a cross-sectional view showing a stacked semiconductor package in accordance with an embodiment of the present invention.

Referring to FIG. 1, a stacked semiconductor package 300 includes a first semiconductor package 100 and a second semiconductor package 200. In the present embodiment, for example, the first semiconductor package 100 is stacked on the second semiconductor package 200.

The first semiconductor package 100 includes a first semiconductor chip 10, first bonding pads 20 and through-electrodes 30.

The first semiconductor chip 10 has the shape of, for example, a rectangular hexahedral plate, although it should be understood that the present invention is not limited in this way. The first semiconductor chip 10 has a first surface 1 and a second surface 2, which faces away from the first surface 1.

The first semiconductor chip 10 includes a data storage section (not shown) for storing data and/or a circuit section (not shown) for processing data.

The first bonding pads 20 are disposed, for example, on the first surface 1 of the first semiconductor chip 10 and are electrically connected with the circuit section. In an embodiment, the first bonding pads 20 are disposed at positions that are separated from the through-electrodes 30 by a predetermined distance. As such, the first bonding pads are illustrated using broken lines. The first bonding pads 20 and the through-electrodes 30 are electrically connected with each other via redistribution lines (not shown), etc.

Through-holes 4 are defined in the first semiconductor chip 10 to pass through the first surface 1 and the second surface 2, and an insulation layer 6 is formed on inner surfaces of the first semiconductor chip 10 which define the through-holes 4. In an embodiment, the insulation layer 6 can comprise any one of, for example, an inorganic insulation layer and an organic insulation layer.

The through-electrodes 30 have a column-like configuration. Portions of the through-electrodes 30 are placed in the through-holes 4, and the remaining portions of the through-electrodes 30 project from the second surface 2 of the first semiconductor chip 10. Examples of metals that can be used to form the through-electrodes 30 include copper, aluminum, silver, and gold, although it should be understood that the present invention is not limited in this way.

The through-electrodes 30 have a height H when measured from the second surface 2 of the first semiconductor chip 10 as shown in FIG. 1. In an embodiment, when the first semiconductor chip 10 and each of second semiconductor chips 210 (in this case three second semiconductor chips 210 as shown in FIG. 1) have a thickness of about 50 μm, H is about 210 μm. In an embodiment, H may vary in the range of about 100 μm to about 500 μm depending upon the thickness of the first and second semiconductor chips 10 and 210.

In an embodiment, the through-electrodes 30 having the column-like configuration can have the cross-sectional shape of a circle, a triangle, a quadrangle, an ellipse, or a polygon when viewed from the top.

Referring again to FIG. 1, the second semiconductor package 200 includes one or more second semiconductor chips 210, second bonding pads 220 are disposed on the respective second semiconductor chips 210, and through-holes 230 are defined through the respective second semiconductor chips 210.

In an embodiment, for example as shown in FIG. 1, the second semiconductor package 200 includes three second semiconductor chips 210.

In an embodiment, for example, the second semiconductor chips 210 can have the same shape and size as the first semiconductor chip 10. Alternatively, the second semiconductor chips 210 can have different shape and size from the first semiconductor chip 10. Also, the first semiconductor chip 10 and the second semiconductor chips 210 can be the same kind or different kinds of semiconductor chips.

The through-holes 230, which are defined through the respective second semiconductor chips 210, are defined at positions that correspond to the through-electrodes 30 of the first semiconductor package 100. In an embodiment, the size of the respective through-electrodes 30 of the first semiconductor package 100 is less than the size of the through-holes 230 which are defined through the second semiconductor chips 210, and as such, the through-electrodes 30 can be inserted into the through-holes 230. In an embodiment, an insulation layer 250 can be formed on the inner surfaces of the second semiconductor chips 210 which are formed due to defining of the through-holes 230. The insulation layer 250 can comprise an inorganic insulation layer or an organic insulation layer.

In an embodiment, the through-holes 230 can have the sectional shape of a circle, an ellipse, or a polygon when viewed from the top.

In the embodiment, in order to electrically connect the through-electrodes 30 and the second bonding pads 220, flowable conductive members 240 are interposed between each of the second semiconductor chips 210 and interposed between the first and second semiconductor chips 10 and 210. According to an embodiment, the flowable conductive members 240 can be disposed around the through-holes 230 of the second semiconductor chips 210 in an annular shape.

The shapes of the flowable conductive members 240 are easily modified by an external force, and the flowable conductive members 240 have conductive properties similar to a metal. Examples of materials that can be used as the flowable conductive members 240 include conductive polymer, conductive particles, and solder paste.

In the embodiment, the through-electrodes 30 and the second bonding pads 220 are electrically connected by the flowable conductive members 240.

Gap-fill members 260 are interposed between the second semiconductor chips 210. The gap-fill members 260 may be any one of epoxy resin, a double-sided adhesive tape, and an adhesive. The gap-fill members 260 function to attach the second semiconductor chips 210 to each other and eliminate gaps between the second semiconductor chips 210.

In an embodiment, when the through-electrodes 30 and the second bonding pads 220 are separated by a predetermined distance (as illustrated by the broken lines), by defining openings in the gap-fill members 260 to communicate the through-holes 230 and the second bonding pads 220, and then filling the flowable conductive members 240 in the openings, the second bonding pads 220 and the through-electrodes 30 can be electrically connected with each other without using redistribution lines.

Figure 2:
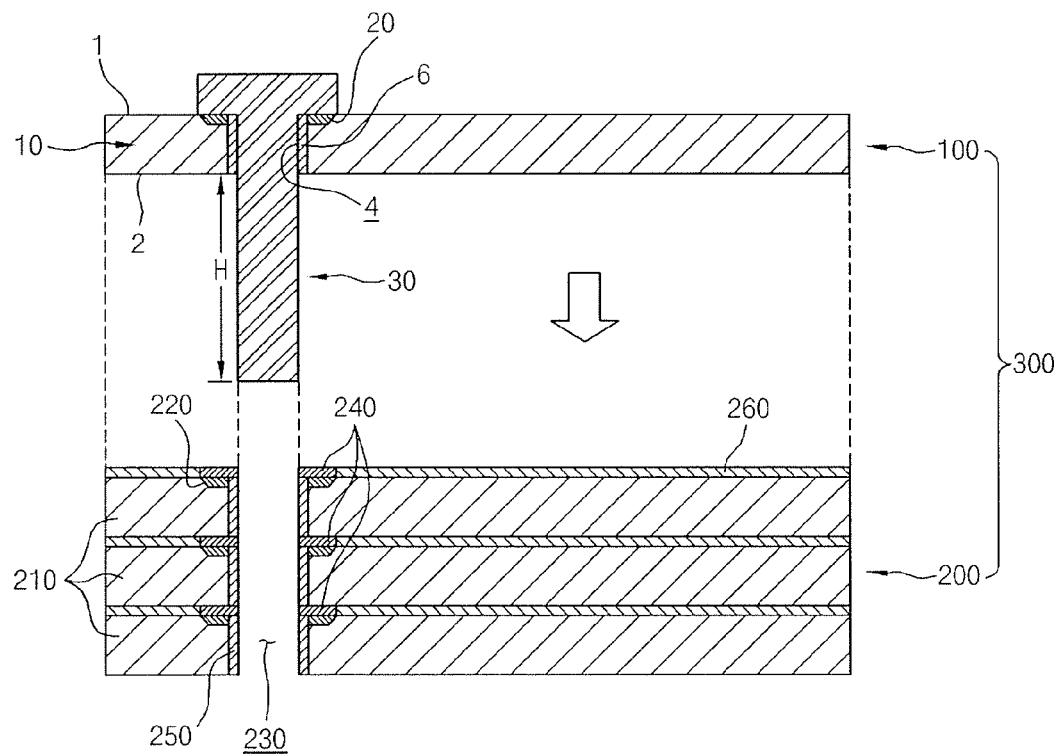
FIG. 2 is a cross-sectional view showing a stacked semiconductor package in accordance with another embodiment of the present invention.

FIG. 2 is a cross-sectional view showing a stacked semiconductor package in accordance with another embodiment of the present invention. The stacked semiconductor package shown in FIG. 2 is substantially the same as the stacked semiconductor package described above with reference to FIG. 1, with the exception of the configuration of the bonding pads. Therefore, description for the same component parts will be omitted herein, and the same technical terms and the same reference numerals will be used to refer to the same or like component parts.

Referring to FIG. 2, a stacked semiconductor package 300 includes a first semiconductor package 100 and a second semiconductor package 200. In the present embodiment, for example, the first semiconductor package 100 is stacked on the second semiconductor package 200.

The respective through-holes 230 of the second semiconductor chips 210 of the second semiconductor package 200 are defined at positions that correspond to the second bonding pads 220, and the flowable conductive members 240 are disposed on the second bonding pads 220. The flowable conductive members 240 electrically connect the second bonding pads 220 and the through-electrodes 30.

Figure 3:
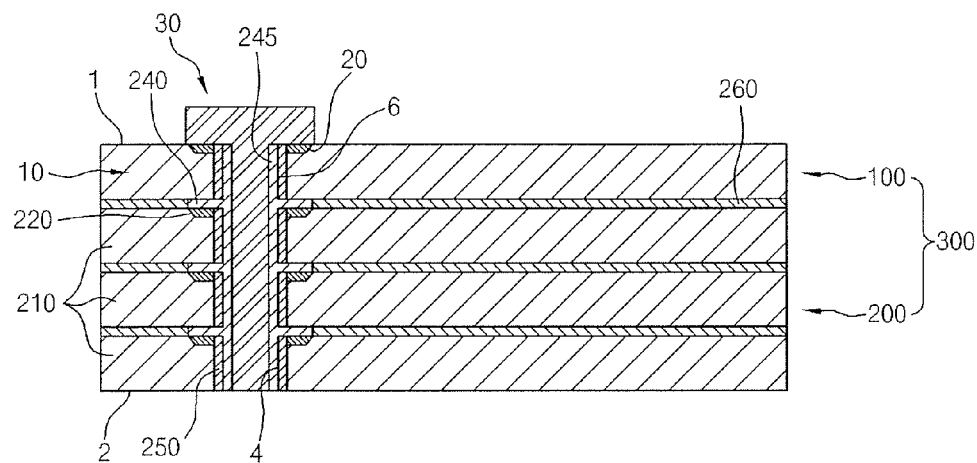
FIG. 3 is a cross-sectional view showing a stacked semiconductor package in accordance with another embodiment of the present invention.

FIG. 3 is a cross-sectional view showing a stacked semiconductor package in accordance with another embodiment of the present invention. The stacked semiconductor package shown in FIG. 3 is substantially the same as the stacked semiconductor package described above with reference to FIG. 1, with the exception of the structure of the flowable conductive members. Therefore, description for the same component parts will be omitted herein, and the same technical terms and the same reference numerals will be used to refer to the same or like component parts.

Referring to FIG. 3, a stacked semiconductor package 300 includes a first semiconductor package 100 and a second semiconductor package 200. In the present embodiment, for example, the first semiconductor package 100 is stacked on the second semiconductor package 200.

The first semiconductor package 100 has through-electrodes 30 which project from the first semiconductor chip 10. The second semiconductor chips 210 of the second semiconductor package 200 has through-holes 230 into which the through-electrodes 30 are to be received.

In an embodiment, when the size of the through-electrodes 30 is less than the size of the through-holes 230, the through-electrodes 30 can be easily inserted into the through-holes 230. However, when the size of the through electrodes 30 is less than the size of the through holes 230, the through-electrodes 30 are likely to fluctuate in the through-holes 230. Conversely, when the size of the through-electrodes 30 is greater than the size of the through-holes 230, the through-electrodes 30 cannot be inserted into the through-holes 230.

Accordingly, while the size of the through-electrodes 30 should be less than the size of the through-holes 230, a problem may occur due to the fact that the through-electrodes 30 can fluctuate in the through-holes 230. For example, the electrical connection between the through electrode 30 and the second semiconductor chips 210 may be poor or inconsistent.

Also, when the size of the through-holes 230 is greater than the size of the through-electrodes 30, even in the case of an alignment error between the through-holes 230 and the through-electrodes 30, the through-electrodes 30 can be appropriately inserted into the through-holes 230 due to the size difference.

In an embodiment, the through-electrodes 30 are prevented from fluctuating in the through-holes 230 by plating the surfaces of the through-electrodes 30. That is, a plated layer can be formed between the through-electrodes 30 and the inner surfaces of the second semiconductor chips 210 which define of the through-holes 230.

However, since the gap between the through-electrodes 30 and the inner surfaces is very narrow, a plating solution cannot smoothly flow into the through-holes 230, and due to this fact, a substantially large amount of time is required to form the plated layer between the through-electrodes 30 and the inner surfaces. Further, when the gap between the through-electrodes 30 and the inner surfaces of the second semiconductor chips 210 is increased in order to more easily form the plated layer, the time require for plating time markedly lengthened. Moreover, when forming the plated layer through the plating process, voids are likely to be created on the inner surfaces of the second semiconductor chips 210.

Hence, it may be inappropriate to form the plated layer between the through-electrodes 30 and the inner surfaces using the plating solution.

According to an embodiment of the present invention, the through-electrodes 30 are formed to have a size less than the size of the through-holes 230 so that the through-electrodes 30 can be easily inserted into the through-holes 230, and flowable conductive members 245, for example, conductive polymer, conductive particles, and solder paste, are filled in the spaces between the through-electrodes 30 and the inner surfaces of the second semiconductor chips 210. The flowable conductive members 245 prevent the through-electrodes 30 from fluctuating in the through-electrodes 230 and electrically connect the through-electrodes 30 and the second bonding pads 220. The flowable conductive members 245 can be set by heat.

Figure 4:
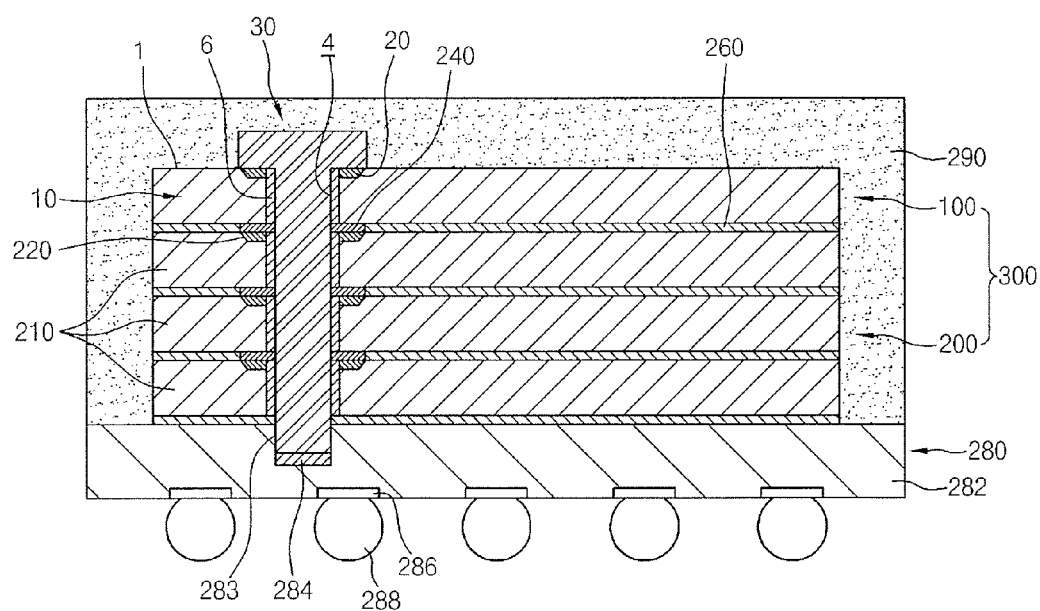
FIG. 4 is a cross-sectional view showing a stacked semiconductor package in accordance with another embodiment of the present invention.

FIG. 4 is a cross-sectional view showing a stacked semiconductor package in accordance with another embodiment of the present invention. The stacked semiconductor package shown in FIG. 4 is substantially the same as the stacked semiconductor package described above with reference to FIG. 1, with the exception of a substrate and a molding member. Therefore, description for the same component parts will be omitted herein, and the same technical terms and the same reference numerals will be used to refer to the same or like component parts.

Referring to FIG. 4, a stacked semiconductor package 300 includes a first semiconductor package 100, a second semiconductor package 200, a substrate 280, and a molding member 290. In the present embodiment, for example, the first semiconductor package 100 is stacked on the second semiconductor package 200.

The first and second semiconductor packages 100 and 200 are stacked and coupled to each other by the through-electrodes 30, and then the stacked and coupled semiconductor packages 100 and 200 are placed on the substrate 280.

Ends of the through-electrodes 30 project from the second semiconductor package 200, as shown in FIG. 4.

The substrate 280 has a substrate body 282, connection pads 284, ball lands 286, and conductive balls 288. In addition, the substrate 280 can further have grooves 283, which are recessed from an upper surface of the substrate 280 to, for example, receive the projected ends of the through electrodes 30.

The connection pads 284 are disposed on the upper surface of the substrate body 282 and the connection pads 284 are formed at positions that correspond to the through-electrodes 30. The ball lands 286 are disposed on the lower surface of the substrate body 282, which faces away from the upper surface, and the ball lands 286 are electrically connected with the connection pads 284. The conductive balls 288 are disposed on the ball lands 286.

The connection pads 284 can also be disposed within the grooves 283 defined in the substrate 280 at positions corresponding to the through-electrodes 30, and the ends of the through-electrodes 30 can be inserted into the grooves 283 to be electrically connected with the connection pads 284.

The connection pads 284 of the substrate 280 are electrically connected with the through-electrodes 30 of the first semiconductor package 100. Solder, an anisotropic conductive film (ACF), or flowable conductive members are interposed between the connection pads 284 and the through-electrodes 30 so that the connection pads 284 and the through-electrodes 30 are electrically connected with each other.

The molding member 290 covers the first and second semiconductor packages 100 and 200 and portions of the upper surface of the substrate 280 so as to protect the first and second semiconductor packages 100 and 200 from shocks and vibrations applied from outside of the package.

Figure 5:
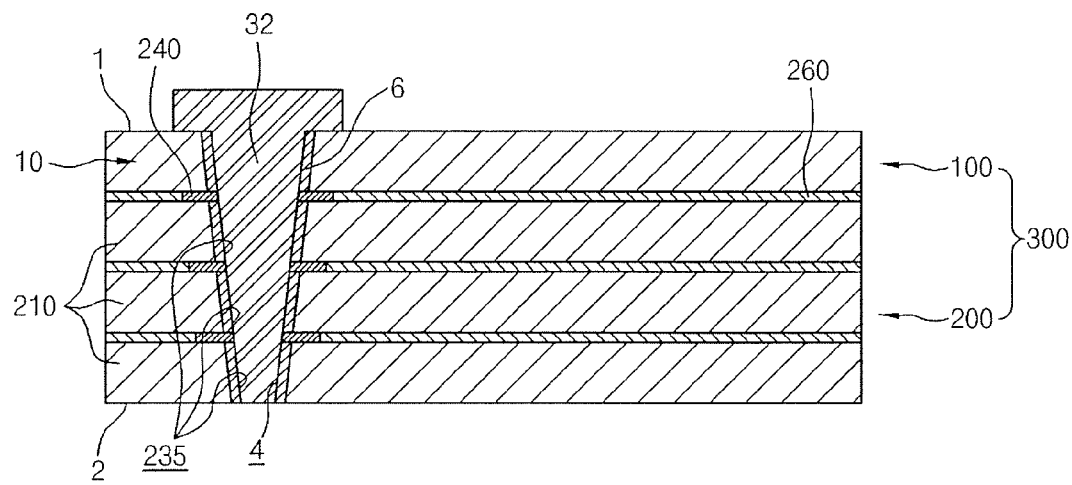
FIG. 5 is a cross-sectional view showing a stacked semiconductor package in accordance with another embodiment of the present invention.

FIG. 5 is a cross-sectional view showing a stacked semiconductor package in accordance with another embodiment of the present invention. The stacked semiconductor package shown in FIG. 5 is substantially the same as the stacked semiconductor package described above with reference to FIG. 1, with the exception of the size and shape of the through-holes and the through-electrodes. Therefore, description for the same component parts will be omitted herein, and the same technical terms and the same reference numerals will be used to refer to the same or like component parts.

Referring to FIG. 5, a stacked semiconductor package 300 includes a first semiconductor package 100 and a second semiconductor package 200. In the present embodiment, for example, the first semiconductor package 100 is stacked on the second semiconductor package 200.

Through-electrodes 32 project from the first semiconductor chip 10 of the first semiconductor package 100 have a configuration in which a cross-sectional area gradually decreases as the through-electrodes 32 extend down from the first surface 1 of the first semiconductor chip 10. For example, the through-electrodes 32 have the sectional shape of a cone or a truncated cone.

When the through-electrodes 32 of the first semiconductor chip 10 of the first semiconductor package 100 have the cross-sectional shape of a cone or a truncated cone, respective through-holes 235 of the second semiconductor chips 210 of the second semiconductor package 200 have a cross-sectional shape that corresponds to that of the through-electrodes 32. Due to this fact, the through-electrodes 32 can be tightly fitted into the respective through-holes 235 of the second semiconductor chips 210.

In the embodiment, by forming the through-electrodes 32 to have the cross-sectional shape of a cone or a truncated cone, the through-electrodes 32 can be coupled into the through-holes 235 of the second semiconductor chips 210 in a self-aligned manner. Also, as the area occupied by the through-holes 235 is decreased for each subsequent chip, the data storage capacities and/or the data processing speeds of the second semiconductor chips 210 can be improved.

Figure 6:
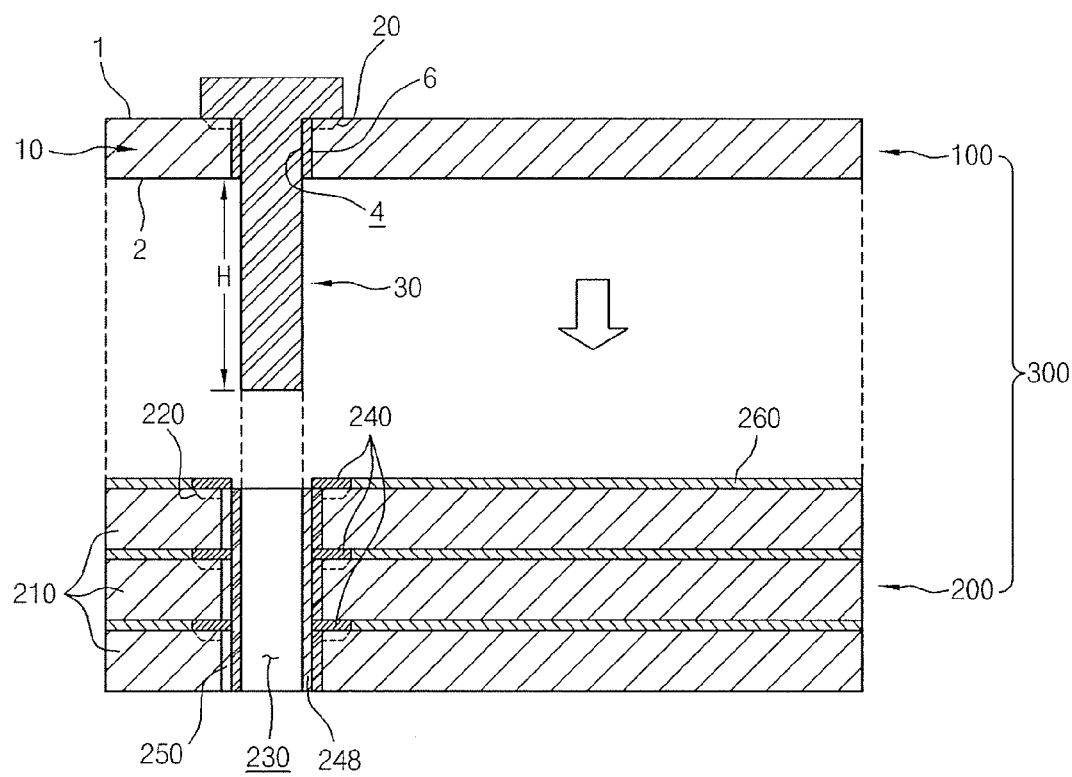
FIG. 6 is a cross-sectional view showing a stacked semiconductor package in accordance with another embodiment of the present invention.

FIG. 6 is a cross-sectional view showing a stacked semiconductor package in accordance with another embodiment of the present invention. The stacked semiconductor package shown in FIG. 6 is substantially the same as the stacked semiconductor package described above with reference to FIG. 1, except a lubrication layer. Therefore, description for the same component parts will be omitted herein, and the same technical terms and the same reference numerals will be used to refer to the same or like component parts.

Referring to FIG. 6, a stacked semiconductor package 300 includes a first semiconductor package 100 and a second semiconductor package 200. In the present embodiment, for example, the first semiconductor package 100 is stacked on the second semiconductor package 200.

As shown in FIG. 6, a lubrication layer 248 is formed on the inner surfaces of the second semiconductor chips 210 which define the through-holes 230 in the second semiconductor chips 210 of the second semiconductor package 200. For example, the lubrication layer 248 can comprise a metal layer having a very small coefficient of friction.

When the through-electrodes 30 are inserted into the through-holes 230, and the flowable conductive members are subsequently introduced between the through-electrodes 30 and the lubrication layer 248, due to the small coefficient of friction, the lubrication layer 248 allows the flowable conductive members to be easily introduced between the lubrication layer 248 and the through-electrodes 30.

The lubrication layer 248 can be formed through a plating process or a physical vapor deposition (PVD) process and a vacuum deposition process.

Figure 7:
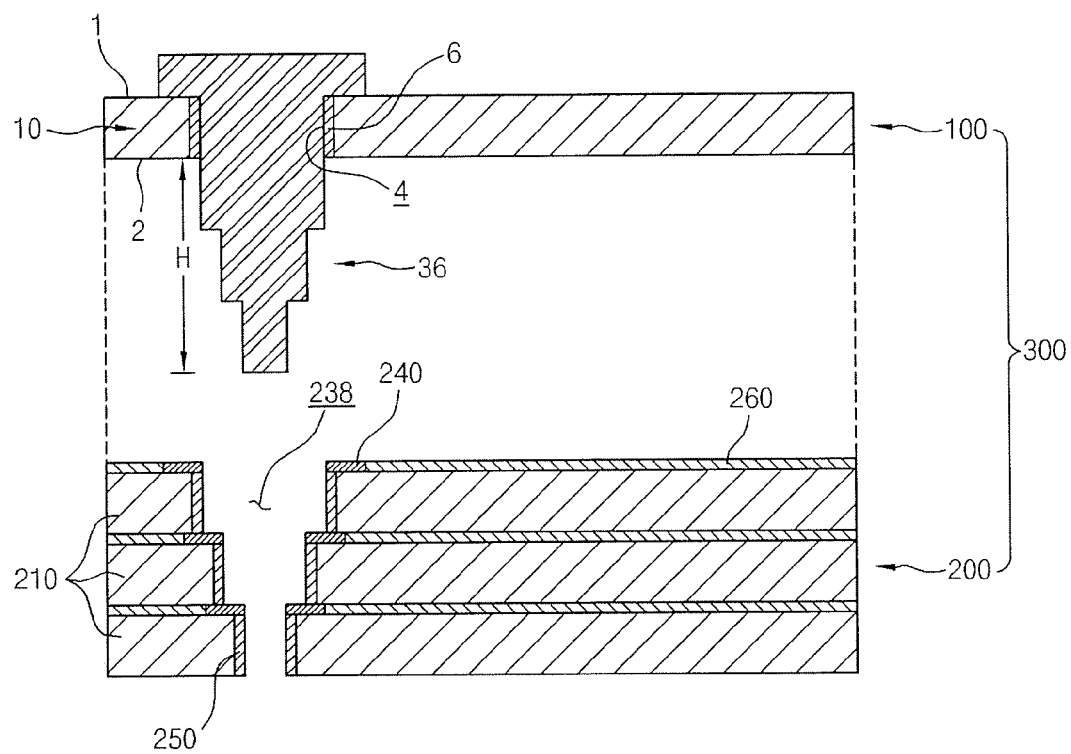
FIG. 7 is a cross-sectional view showing a stacked semiconductor package in accordance with another embodiment of the present invention.

FIG. 7 is a cross-sectional view showing a stacked semiconductor package in accordance with another embodiment of the present invention. The stacked semiconductor package shown in FIG. 7 is substantially the same as the stacked semiconductor package described above with reference to FIG. 1, with the exception of the size and shape of through-holes and the of through-electrodes. Therefore, description for the same component parts will be omitted herein, and the same technical terms and the same reference numerals will be used to refer to the same or like component parts.

Referring to FIG. 7, a stacked semiconductor package 300 includes a first semiconductor package 100 and a second semiconductor package 200. In the present embodiment, for example, the first semiconductor package 100 is stacked on the second semiconductor package 200.

As shown in FIG. 7, the through-electrodes 36 which project from the first semiconductor chip 10 of the first semiconductor package 100 are formed to have a configuration in which a cross-sectional area thereof decreases in a stepwise manner from the first surface 1 of the first semiconductor chip 10. The through-electrodes 36 have the cross-sectional shape of steps. That is, the width of the an opening defined in each of the semiconductor chips 10, 210 is constant within the chip 10, 210, but the width of the opening in increases between each subsequent chip 10, 210.

When the through-electrodes 36 of the first semiconductor chip 10 of the first semiconductor package 100 have the cross-sectional shape of steps, respective through-holes 238 of the second semiconductor chips 210 of the second semiconductor package 200 have a cross-sectional shape that corresponds to that of the through-electrodes 36. Due to this fact, the through-electrodes 36 can be tightly fitted into the respective through-holes 238 of the second semiconductor chips 210.

In the embodiment, by forming the through-electrodes 36 to have the sectional shape of a step, the through-electrodes 36 can be coupled into the through-holes 238 of the second semiconductor chips 210 in a self-aligned manner. Also, as the area occupied by each subsequent through-hole 238 is decreased, the data storage capacities and/or the data processing speeds of the second semiconductor chips 210 can be improved.

As is apparent from the above description, the present invention provides advantages in that through-electrodes are projectedly formed in any one semiconductor chip, through-holes in which the through-electrodes are to be fitted are defined in other semiconductor chips, and the through-electrodes and the through-holes are engaged with each other. As a consequence, the manufacturing cost of a stacked semiconductor package can be reduced, and it is possible to prevent defects from being caused in through-electrodes. Further, the overall thickness of the stacked semiconductor package can be significantly decreased.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A stacked semiconductor package comprising:
   a first semiconductor package comprising:
      a first semiconductor chip having a first surface and a second surface facing away from the first surface comprising;
         a first bonding pad disposed on the first surface of the first semiconductor chip; and
         a through-electrode electrically connected with the first bonding pad, passing through the first and second surfaces, such that a portion of the through-electrode extends out of the second surface; and
   a second semiconductor package comprising a second semiconductor chip having a through-hole defined therein, wherein the portion of the through-electrode that extends out of the second surface is inserted into the through-hole and electrically connected with a second bonding pad,
   wherein the second semiconductor chip comprises at least two stacked second semiconductor chips each having a through-hole defined therein, and
   wherein centers of each of the through-hole are substantially aligned, and a cross-sectional area of each the through-holes decreases in the direction that through-electrode extends from the first surface of the first semiconductor chip, such that the through-holes defined in the at least two stacked second semiconductor chips have a cross-sectional shape of steps, and
   a cross-sectional shape of the through-electrode corresponds to the cross-sectional shape of the through-holes defined in the at least two stacked second semiconductor chips.

2. The stacked semiconductor package according to claim 1, wherein the through-hole is defined at a position corresponding to the first bonding pad and the second bonding pad.

3. The stacked semiconductor package according to claim 2, further comprising:
   a flowable conductive member interposed between the first semiconductor chip and the second semiconductor chip, and electrically connecting the second bonding pad and the through-electrode.

4. The stacked semiconductor package according to claim 3, wherein the flowable conductive member contains at least one of a conductive polymer, a conductive particle, and a solder paste.

5. The stacked semiconductor package according to claim 1, further comprising:
   a gap-fill member interposed between the first semiconductor chip and the second semiconductor chip, and attaching the first semiconductor chip and second semiconductor chip.

6. The stacked semiconductor package according to claim 1, wherein the through-hole defined in the second semiconductor chip has a first cross-sectional area, and the through-electrode has a second cross-sectional area less than the first cross-sectional area, and
   flowable conductive members are interposed between the through-electrode and an inner surface of the second semiconductor chip defining the through-hole.

7. The stacked semiconductor package according to claim 1, further comprising:
   a substrate comprising a connection pad disposed thereon, the connection pad being electrically connected with an end of the through-electrode.

8. The stacked semiconductor package according to claim 7, wherein the substrate has a groove defined therein at a position corresponding to the end of the through-electrode, and the connection pad is disposed within the groove.

9. The stacked semiconductor package according to claim 1, wherein a cross-sectional shape of the through-hole of the second semiconductor chip is one of a circle, a triangle, a quadrangle, an ellipse, and a polygon.

10. The stacked semiconductor package according to claim 9, wherein a cross-sectional shape of the through-electrode is one of a circle, a triangle, a quadrangle, an ellipse, and a polygon.

11. The stacked semiconductor package according to claim 1, further comprising:
    an insulation layer formed the inner surfaces of the second semiconductor chip defining of the through-hole; and
    a lubrication layer formed on the insulation layer.

12. A stacked semiconductor package comprising:
    a first semiconductor package comprising:
       a first semiconductor chip having an upper surface and a lower surface opposite the upper surface, and having a first through-hole defined therein so as to pass through the first surface and the second surface, the first semiconductor chip comprising:
          a first bonding pad disposed on the upper surface of the first semiconductor chip; and
          a through-electrode electrically connected with the first bonding pad, passing through the upper surface and the lower surface of the first semiconductor chip, such that a portion of the through-electrode extends beyond the lower surface of the first semiconductor chip; and
    a second semiconductor package disposed beneath the lower surface of the first semiconductor chip, the second semiconductor package comprising at least two stacked second semiconductor chips,
    wherein a second through-hole is defined in each of the at least two stacked second semiconductor chips, and the first through-hole and each of the second through-holes are substantially aligned, and
    wherein a width of each successive second through-hole below the lower surface of the first semiconductor chip is less than a width of a preceding second through-hole, such that the second through-holes defined in the at least two stacked second semiconductor chips have a cross-sectional shape of steps, and
    wherein the through-electrode has a cross-sectional shape of steps which corresponds to the cross-sectional shape of the second through-holes defined in the at least two stacked second semiconductor chips.

13. A stacked semiconductor package of claim 12, further comprising:
    a flowable conductive member disposed on an upper surface of each of the at least two stacked semiconductor chips,
    wherein the through-electrode contacts the flowable conductive member disposed on the upper surface of each of the at least two stacked semiconductor chips.

* * * * *